(12) United States Patent
Kajiyama

(10) Patent No.: US 8,149,386 B2
(45) Date of Patent: Apr. 3, 2012

(54) ILLUMINATION OPTICAL SYSTEM, EXPOSURE APPARATUS USING THE SAME AND DEVICE MANUFACTURING METHOD

(75) Inventor: Kazuhiko Kajiyama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 442 days.

(21) Appl. No.: 12/390,315

(22) Filed: Feb. 20, 2009

(65) Prior Publication Data

US 2009/0213355 A1   Aug. 27, 2009

(30) Foreign Application Priority Data

Feb. 27, 2008   (JP) .................. 2008-045504

(51) Int. Cl.
*G03B 27/70* (2006.01)

(52) U.S. Cl. .............. 355/66; 355/53; 355/67

(58) Field of Classification Search ............ 355/53, 355/66, 67
See application file for complete search history.

(56) References Cited

U.S. PATENT DOCUMENTS

| | | | | |
|---|---|---|---|---|
| 5,581,605 A * | 12/1996 | Murakami et al. | | 378/84 |
| 5,677,939 A * | 10/1997 | Oshino | | 378/34 |
| 6,452,661 B1 | 9/2002 | Komatsuda | | |
| 6,919,951 B2 * | 7/2005 | Tsuji | | 355/67 |
| 7,023,953 B2 * | 4/2006 | Komatsuda | | 378/34 |
| 7,133,489 B2 * | 11/2006 | Miyake et al. | | 378/34 |

FOREIGN PATENT DOCUMENTS

| | | |
|---|---|---|
| JP | 11-312638 A | 11/1999 |
| JP | 2003-045574 A | 2/2003 |
| JP | 2004-510340 A | 4/2004 |
| WO | 0227400 | 4/2002 |

\* cited by examiner

*Primary Examiner* — Edward Glick
*Assistant Examiner* — Thomas R Artman
(74) *Attorney, Agent, or Firm* — Canon USA Inc IP Division

(57) ABSTRACT

An illumination optical system includes a pair of fly-eye mirrors configured to receive light from a light source, a first condenser configured to condense light from the pair of fly-eye mirrors, a reflection type integrator configured to receive light from the first condenser, the reflection type integrator including a plurality of cylindrical reflective surfaces having parallel generating line directions, an aperture stop arranged perpendicular to the generating line direction, and a second condenser configured to superpose on an illuminated surface luminous fluxes from a plurality of cylindrical reflective surfaces of the reflection type integrator.

6 Claims, 11 Drawing Sheets

ILLUMINATION OPTICAL SYSTEM, EXPOSURE APPARATUS USING THE SAME AND DEVICE MANUFACTURING METHOD

BACKGROUND OF THE INVENTION

1. Field of the Invention

The present invention relates to an exposure apparatus. The present invention is suitable, for example, for an illumination optical system for an exposure apparatus using the extreme ultraviolet ("EUV") light having a wavelength from 10 to 15 nm for the exposure light.

2. Description of the Related Art

A conventional EUV exposure apparatus uses the EUV light having a wavelength from 10 to 15 nm, and requires an illumination optical system configured to efficiently and uniformly illuminate an illumination area on an original (reticle).

A dioptric optical system that uses a lens is not practical since a material's absorption of the light significantly increases in the EUV region. Therefore, the EUV exposure apparatus uses a catoptric optical system.

Japanese Patent Laid-Open No. ("JP") 11-312638, Japanese Domestic Publication No. ("JD") 2004-510340, JP 2003-045774 disclose such an illumination optical system for the EUV exposure apparatus.

JP 11-312638 discloses an illumination optical system that uses a first fly-eye mirror and a second fly-eye mirror which have arc contours, and is configured to illuminate an arc area. The first and second fly-eye mirrors are arranged so that a plurality of light source images can be formed on the second fly-eye mirror, and the two fly-eye mirrors serve as one integrator.

JD 2004-510340 discloses an illumination optical system that includes a first fly-eye mirror and a second fly-eye mirror which have rectangular contours, and at least one high-incidence type field mirror configured to illuminate an arc area. The first and second fly-eye mirrors are arranged so that a plurality of light source images can be formed on the second fly-eye mirror, and the two fly-eye mirrors serve as one integrator.

JP 2003-045774 discloses an illumination optical system in which a first corrugate plate integrator (which is an integrator in which a multiplicity of cylindrical surfaces are arranged in parallel) and a first condenser uniformly illuminate a second corrugate plate integrator, and the second corrugate plate integrator and the second condenser illuminate an arc area.

However, these prior art structures have the following problems in efficiently and uniformly illuminating the illumination area on the original (reticle):

The illumination optical system disclosed in JP 11-312638 has a difficulty in manufacturing an arc-shaped fly-eye mirror.

The illumination optical system disclosed in JD 2004-510340 has a problem with a distortion of an effective light source distribution and a degradation of an imaging characteristic because the rectangular illumination area is distorted by the high-incidence type field mirror.

The illumination optical system disclosed in JP 2003-045774 eliminates the unevenness of the effective light source using two corrugate plate integrators, but has a problem of a decrease of the illumination efficiency due to lack of a field mirror when a light source has a large etendue.

SUMMARY OF THE INVENTION

The present invention provides an illumination optical system configured to restrain an unevenness of an effective light source caused by the influence of the light intensity fluctuation and the angular distribution of a light source and to efficiently illuminate an arc area even when the light source has a large etendue.

An illumination optical system according to one aspect of the present invention includes a pair of fly-eye mirrors configured to receive light from a light source, a first condenser configured to condense light from the pair of fly-eye mirrors, a reflection type integrator configured to receive light from the first condenser, the reflection type integrator including a plurality of cylindrical reflective surfaces having parallel generating line directions, an aperture stop arranged perpendicular to the generating line direction; and a second condenser configured to superpose on an illuminated surface luminous fluxes from a plurality of cylindrical reflective surfaces of the reflection type integrator.

Further features of the present invention will become apparent from the following description of exemplary embodiments (with reference to the attached drawings).

DESCRIPTION OF THE EMBODIMENTS

Embodiments of the present invention will now be described with reference to the accompanying drawings.

First Embodiment

Figure 1:
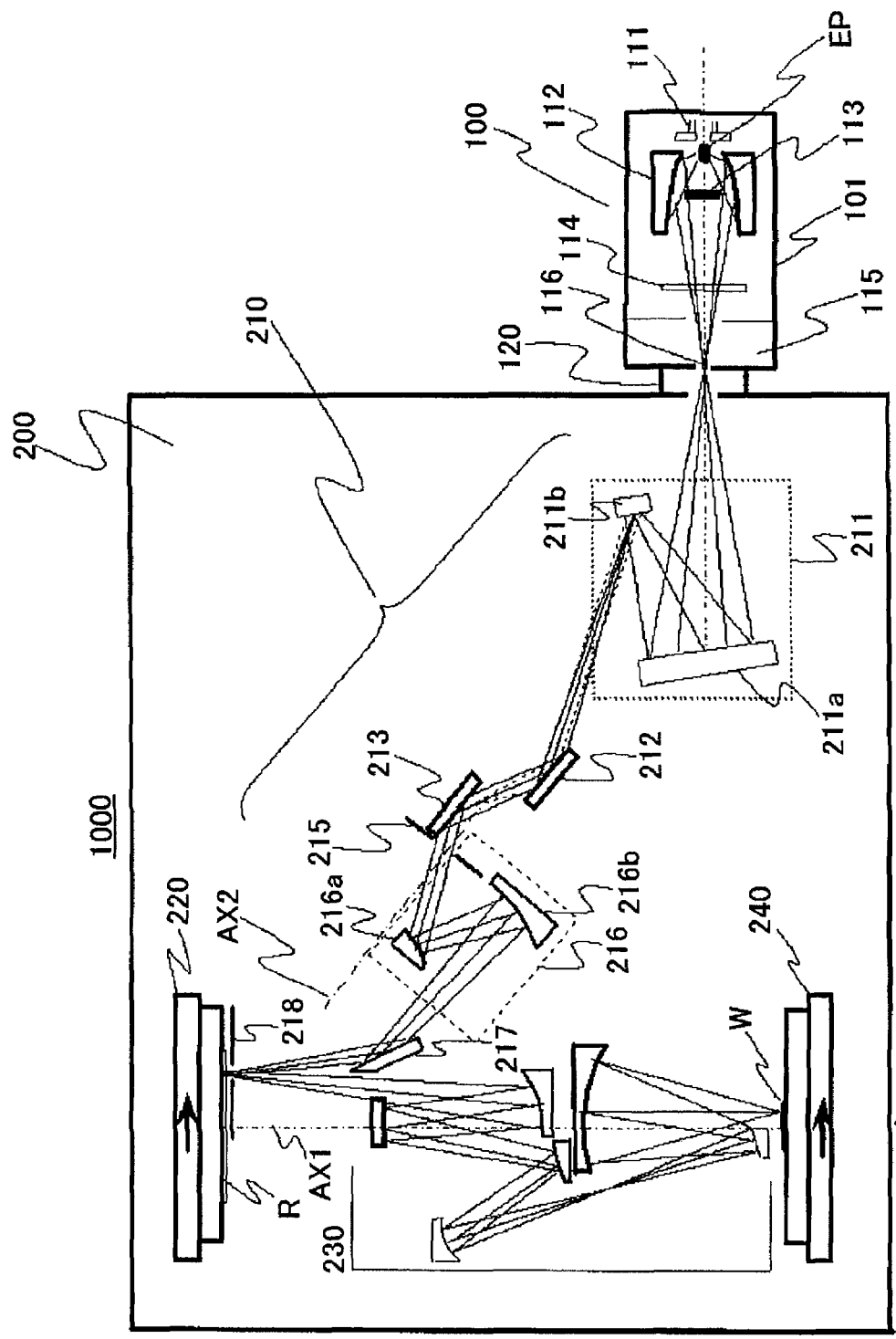
FIG. 1 shows a schematic view of first and second embodiments.

Referring now to FIG. 1, a description will be given of an exposure apparatus 1000 according to a first embodiment. FIG. 1 is a schematic structural view of the exposure apparatus 1000.

The exposure apparatus 1000 is a EUV exposure apparatus that exposes a circuit pattern of a mask (reticle) R onto a wafer (substrate) W using the EUV light (having a wavelength, for example, of 13.5 nm) for the exposure light in a step-and-scan manner.

The exposure apparatus 1000 includes a light source part 100 and an apparatus body 200. Each component in the light source part 100 is housed in a vacuum chamber 101 and each component in the apparatus body 200 is housed in a vacuum chamber 201. The vacuum chambers 101 and 201 are connected by a connector 120. During exposure, the insides of the vacuum chambers 101 and 201 maintain vacuum so as to prevent attenuations of the EUV light.

A description will now be given of each component in the light source part 100. The light source part 100 includes a discharge header 111, a condenser mirror 112, a debris filter 113, a wavelength filter 114, a differential pumping mechanism 115, and an aperture 116 in the vacuum chamber 101.

The condenser mirror 112 includes a rotational elliptical mirror etc. configured to collect the EUV light that is approximately isotropically radiated from a plasma emission part EP. The debris filter 113 reduces an infiltration of debris (flying particle), which occurs with a generation of the EUV light, into optical path. The wavelength filter 114 removes the light having a wavelength other than the EUV light generated by the emission part EP. The differential pumping mechanism 115 decreases an internal pressure from the vacuum chamber 101 toward the vacuum chamber 201 step by step. The aperture 116 has a pinhole-shaped opening arranged near the condensing point of the condenser mirror 112. The EUV light as the exposure light passes through this aperture 116 and advances to the apparatus body 200 side.

While this embodiment uses a discharge type plasma light source for a light source part 100, another type of EUV light source may be used, such as a laser plasma light source.

Next follows a description of each component of the apparatus body 200. The apparatus body includes an illumination optical system 210, a mask stage 220, a projection optical system 230, and a wafer stage 240 in the vacuum chamber 201.

The illumination optical system 210 is a means for propagating the EUV light and illuminating the mask R. The illumination optical system 210 includes a pair of fly-eye mirrors 211, a first condenser 212, a corrugate plate integrator as a reflection type integrator 213, an aperture stop 215, a second condenser 216 as an arc forming optical system, a plane mirror 217, and a slit 218. A pair of fly-eye mirrors 211 includes a first fly-eye mirror 211a and a second fly-eye mirror 211b. The corrugate plate integrator 213 includes a plurality of cylindrical reflective surfaces having parallel general line directions. The second condenser 216 includes a convex mirror 216a and a concave mirror 216b.

Figure 2A:
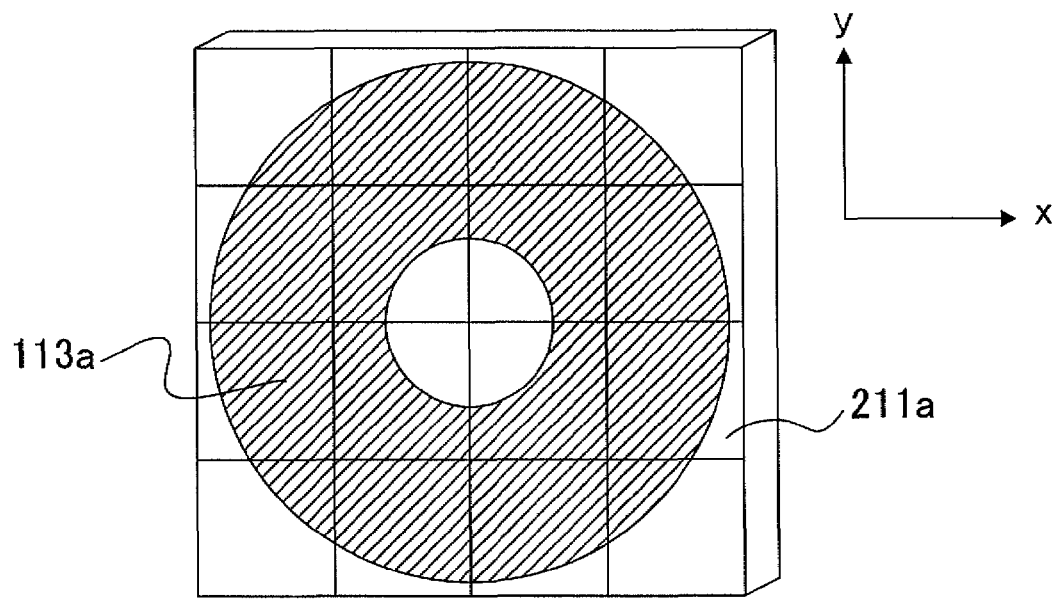
FIGS. 2A and 2B are views showing a fly-eye mirror according to the first embodiment.

A EUV luminous flux IL that has passed through the above aperture 116 enters the first fly-eye mirror 211a and is split into a multiplicity of luminous fluxes. FIG. 2A shows the state of the first fly-eye mirror 211a. The first embodiment sets the number of divisions to 4×4 in the Y-axis direction as a slit width direction and in the X-axis direction as a slit length direction of the arc illumination area, which will be described later. The Y-axis direction corresponds to a direction parallel to the general line of each cylindrical reflective surface of the corrugate plate integrator 213, and the X-axis direction corresponds to a direction orthogonal to the general line (or an arrangement direction of the plurality of cylindrical reflective surfaces).

The area of the incident luminous flux upon the first fly-eye mirror 211a is an area where a center of the circle seems to be blanked as shown by 113a in FIG. 2A and which is caused by the debris filter 113. The fly-eye mirror 211a has an irradiation area and a non-irradiation area of the luminous flux, such as the area 113a, but the influence of the luminous unevenness and the unevenness of the effective light source is insignificant due to the corrugate plate integrator 213 as the second integrator, which will be described later. However, when the influence is significant, it is effective to reduce the influence by increasing the number of divisions of the first fly-eye mirror 211a and by using only the irradiation part of the luminous flux.

Figure 2B:
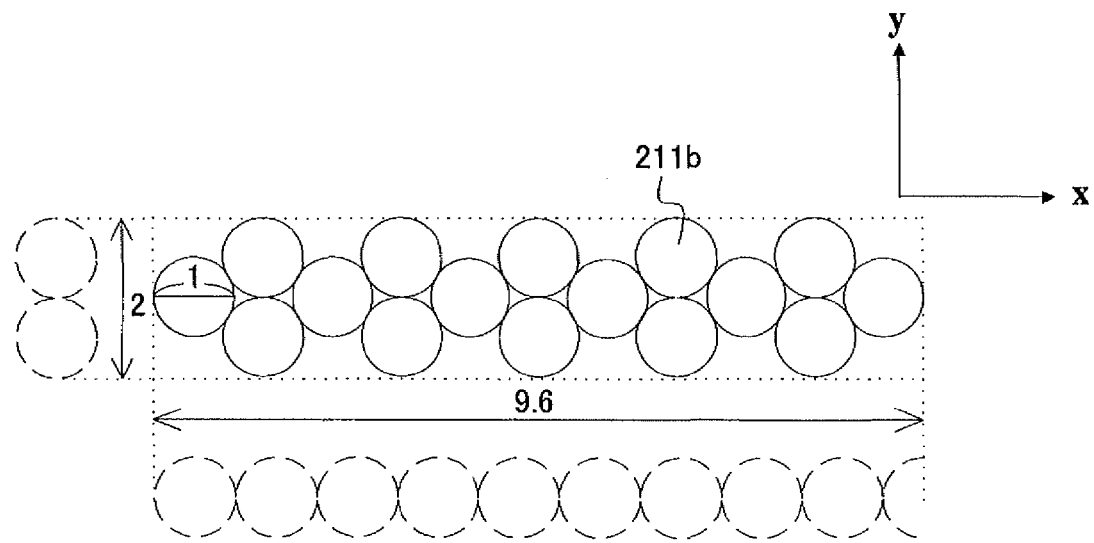

The luminous fluxes divided by the first fly-eye mirror 211a are condensed on the second fly-eye mirror 211b, and form a plurality of images of the secondary light sources. As shown in FIG. 2B, the number of elements of the second fly-eye mirror 211b in the slit width direction is different from that in the slit length direction. That the number in the slit width direction is different from that in the slit length direction means that the second fly-eye mirror 211b has a length (or the number of element mirrors) in the Y-axis direction different from a length in the X-axis direction (or the number of element mirrors). For example, when it is assumed that one element mirror has a diameter of 1 in the second fly-eye mirror 211b that includes a plurality of circular element mirrors shown in FIG. 2B, the length in the slit width direction is 2 and the length in the slit length direction is about 9.6. This configuration attempts to adjust a Lagrange's invariant both in the slit width direction and in the slit length direction; the number of divisions in the first fly-eye mirror 211a of the first embodiment is 4×4 in the slit width direction and in the length direction, and the number of divisions in the second fly-eye mirror 211b is about 2×8. The Lagrange's invariant of each element mirror is about $\frac{1}{4}$ as much as the Lagrange's invariant of the light source both in the slit width direction and in the slit length direction by the first fly-eye mirror 211a. Next, the Lagrange's invariant of each element mirror is summed up by the number in the slit width direction and the number in the slit length direction of the second fly-eye mirror 211b. Therefore, the first embodiment adjusts the Lagrange's invariant in the slit width direction that has passed through the fly-eye mirror to half $\{(\frac{1}{4})\times 2\}$ the Lagrange's invariant of the light source. The Lagrange's invariant is adjusted twice $\{(\frac{1}{4})\times 8\}$ in the length direction, and the contour of the second fly-eye mirror 211b is close to a rectangular shape that is long in the slit length direction.

At this time, each optical element in the first fly-eye mirror 211a is angularly adjusted so as to correspond to each optical element in the second fly-eye mirror 211b. In addition, each optical element in the second fly-eye mirror 211b is angularly adjusted so as to deflect a luminous flux from the first fly-eye mirror 211a to the first condenser 212. Since the second fly-eye mirror 211b has a conjugate relationship with the aperture 116, an individual shape of the second fly-eye mirror 211b may be approximately equal to the shape of the aperture 116.

The above fly-eye mirrors 211a and 211b are made of reflective multilayer films configured to efficiently reflect the EUV light, and become a high temperature during exposure because it absorbs part of the radiation energy from the high-temperature plasma emission part EP. Therefore, it is made of a material having a high thermal conductivity, such as metal, possesses a cooling means (not shown) such as water cooling, and is always cooled during the exposure.

Although not specifically stated in the following description, a reflective surface of each mirror used for the optical system is made of reflective multilayer films configured to efficiently reflect the EUV light, and the mirror is made of a material having a high thermal conductivity, such as metal, or possesses a cooling means (not shown), if necessary.

Next, a plurality of luminous fluxes from the second fly-eye mirror 211b are superposed by the first condenser 212, and incident as EUV luminous fluxes IL so as to approximately uniformly illuminate the integrator 213 that has a plurality of cylindrical surface mirrors. The EUV luminous flux IL incident upon the integrator is divided and diverged by each cylindrical surface, and passes through the aperture stop 215, which will be described later. An opening of the aperture stop 215 determines a shape of the effective light source.

The second condenser 216 is an optical system configured to condense the light from the corrugate plate integrator 213 in an arc shape, and to superpose luminous fluxes from a plurality of tertiary light sources on an illuminated surface (mask R) via a plane mirror 217. The second condenser 216 forms an arc illumination area suitable for an illumination of the mask R through operations of the convex mirror 216a and a concave mirror 216b. The plane mirror 217 is a member configured to introduce the light from the second condenser 216 to the mask R at a predetermined angle.

The light that is divided and diverged by each cylindrical reflective surface of the corrugate plate integrator 213 is condensed in an arc shape by the second condenser 216 and forms an arc illumination area having a uniform luminous distribution on the opening of the slit 218 and ultimately on the mask R surface. The center of curvature of the arc illumination area is set to an optical axis (central axis) AX1 of the projection optical system 230.

Figure 12:
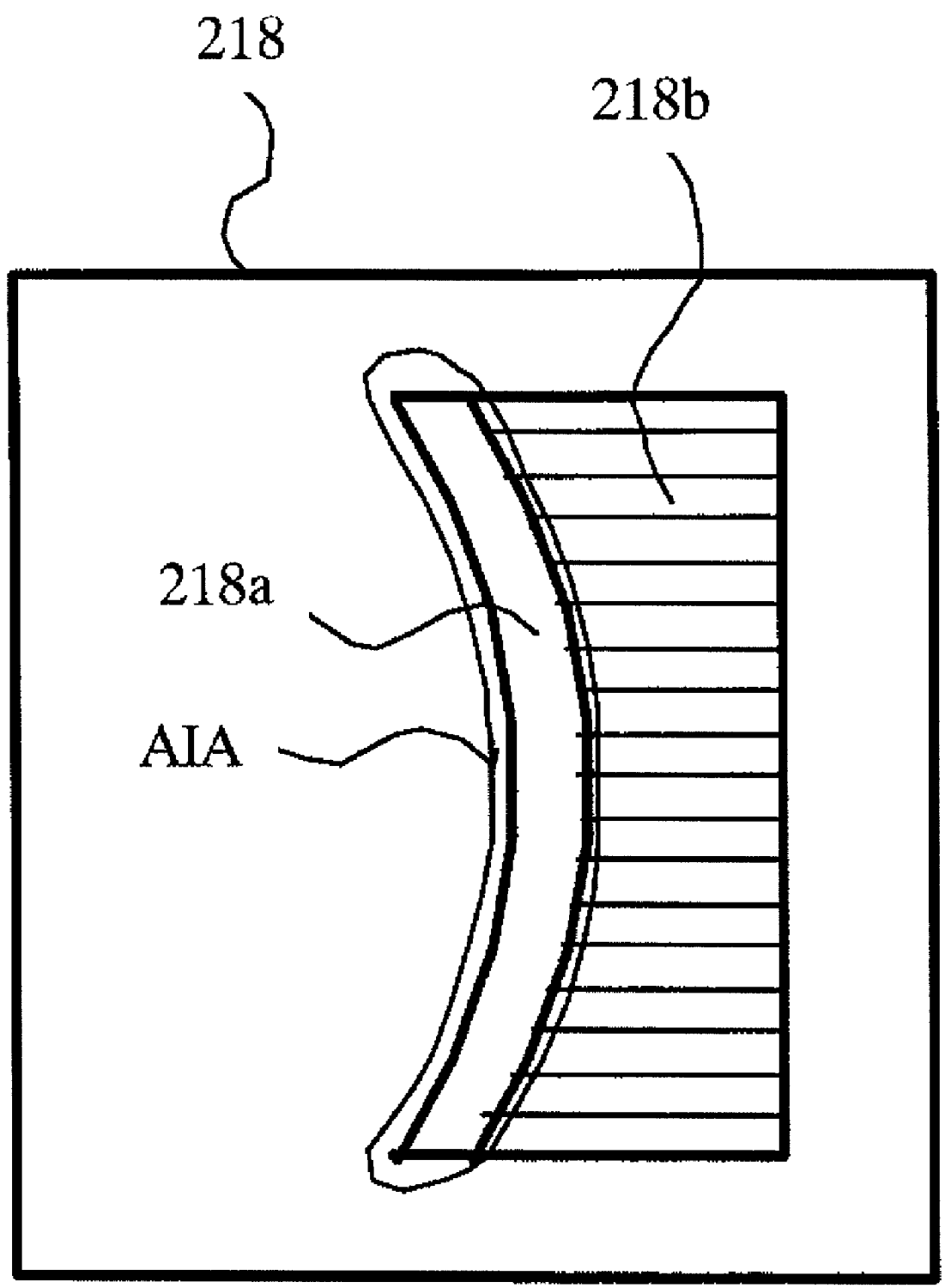
FIG. 12 is a schematic view of an arc slit.

The slit 218 is a member that determines an illumination area on the mask R. As shown in a plane view shown in FIG. 12, the slit 218 has an arc opening 218a, and a movable part 218b configured to partially adjust a width of the opening 218a. In FIG. 12, AIA denotes an arc irradiation area formed by the corrugate plate integrator 213 and the second condenser 216. The illumination area AIA and the opening 218a determine the illumination area of the mask R.

In scanning exposure, any luminance unevenness in the slit length direction of the opening 218a causes the exposure unevenness. In order to solve this problem, a slit width is adjusted by using the movable part 218b in accordance with a position in the slit length direction. This configuration provides an exposure with a uniform accumulated exposure dose on the entire surface of the exposure region. During the scanning exposure, the slit 218 is kept stationary to the projection optical system 230.

The mask R is a reflection mask, on which a circuit pattern to be transferred is formed. The circuit pattern is formed on a multilayer mirror and a nonreflecting part made of a EUV absorber on it. The mask R is attached to the mask stage 220 via a chuck, and driven in an arrow direction by the mask stage 220.

The projection optical system 230 includes a plurality of (typically six) multilayer mirrors, and is designed so that an off-axis arc area off the optical axis AX1 can possess a good imaging characteristic. The projection optical system 230 is configured to be an image-side telecentric system. On the other hand, the projection optical system 230 is configured to be non-telecentric on the object side (mask R side) so as to avoid physical interference with the illumination light incident upon the mask R. For example, this embodiment inclines an object-side principal ray by about 6° relative to the normal direction of the mask R.

The diffracted light generated from the mask R reaches the wafer W via the projection optical system 230, and a reduced image of the circuit pattern formed on the mask R is projected onto the wafer W. A wafer stage 240 can support the wafer W via a chuck, and move the wafer W in the arrow direction. Since the exposure apparatus 1000 of this embodiment is a step-and-scan type exposure apparatus, the mask R and the wafer W are scanned by the respective stages at a velocity ratio corresponding to a reduction ratio in exposing and transferring the circuit pattern onto the plate.

Figure 3A:
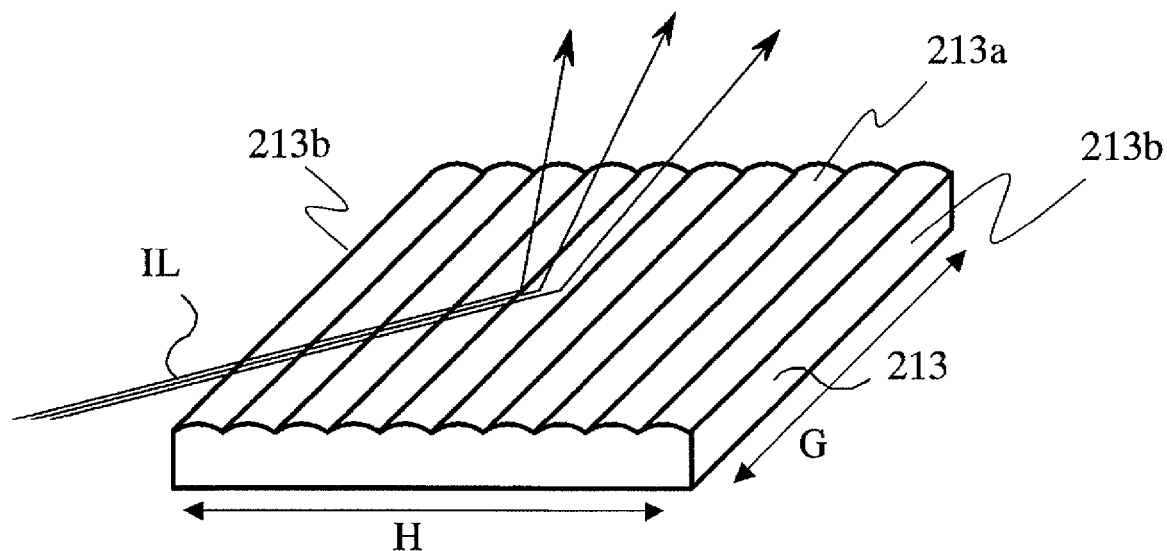
FIGS. 3A and 3B are schematic views of an integrator.
Figure 3B:
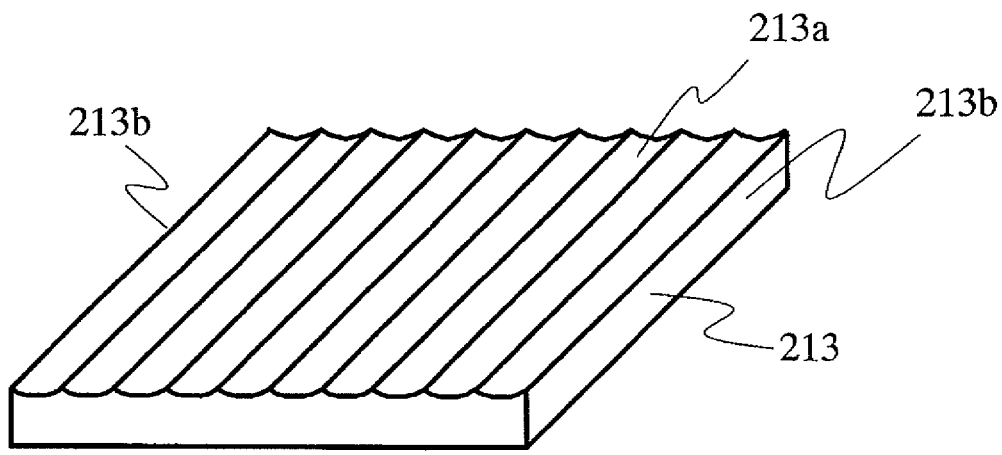
Figure 4:
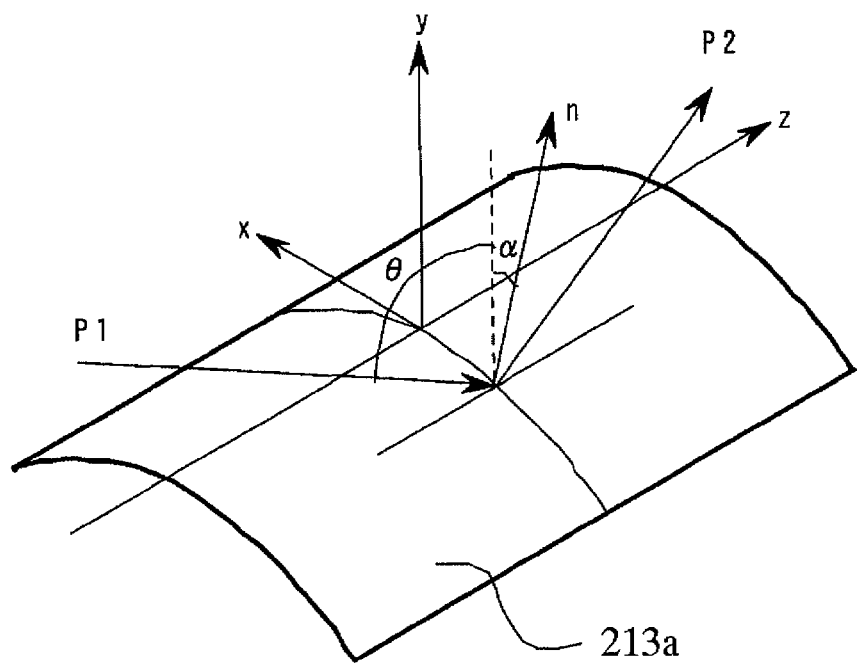
FIG. 4 is a view for explaining a reflection of the light on the integrator.
Figure 5:
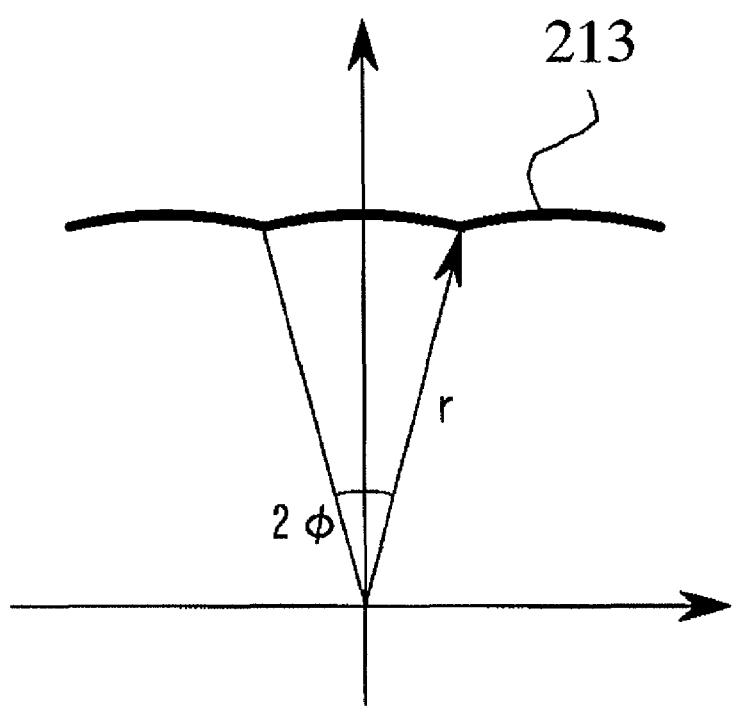
FIG. 5 is a view for explaining a sectional shape of the integrator.
Figure 6:
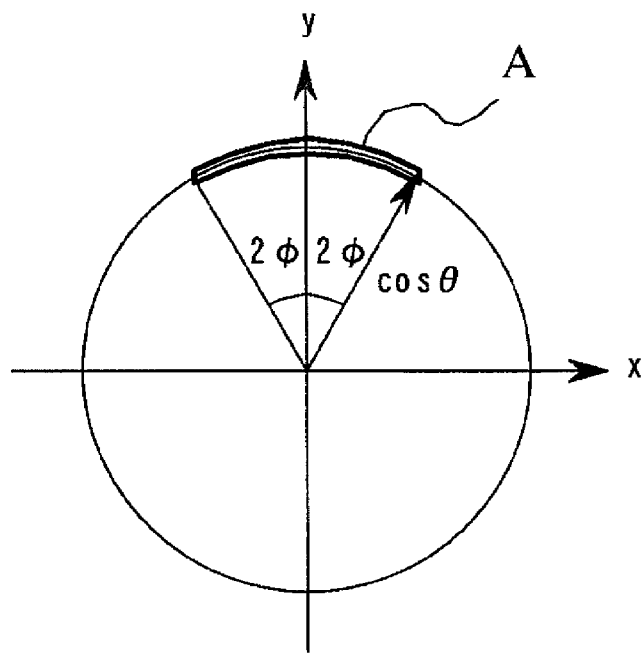
FIG. 6 is a view for explaining an angular distribution of a luminous flux reflected on the cylindrical surface of the integrator.

Referring now to FIGS. 3A to 6, a description will be given of a principle of a uniform illumination of the arc area by the corrugate plate integrator 213. FIGS. 3A and 3B are enlarged perspective views of the corrugate plate integrator 213, as described above. FIG. 4 is a schematic perspective view for explaining a reflection of the EUV light on a convex cylindrical reflective surface 213a. FIG. 5 is a partially enlarged sectional view of the corrugate plate integrator 213. FIG. 6 is a view showing an angular distribution of the EUV light reflected on the cylindrical reflective surface 213a.

As shown in FIG. 3A, when the collimated light IL is incident upon the integrator 213 having a plurality of cylindrical reflective surfaces 213a, a linear light source that extends in the general line direction G is formed near the surface of the integrator 213. An angular distribution of the EUV light radiated from the linear light source forms a conical plane. Next, the second condenser 216 that has a focal point at a position of the linear light source reflects the EUV light and illuminates the mask R or the plane conjugate with the mask R, realizing the arc illumination.

Referring to FIG. 4, a description will be given of a behavior of the reflected light when the illumination light IL is incident upon one cylindrical reflective surface 213a in order to explain an operation of the corrugate plate integrator 213. Assume that the illumination light IL is incident upon one cylindrical reflective surface 213a at an angle $\theta$ to an XY plane perpendicular to its center axis (or z axis). A ray vector of the illumination light IL is defined as $P1=(0, -\cos\theta, \sin\theta)$, and a normal vector of the cylindrical reflective surface is defined as $n=(-\sin\alpha, \cos\alpha, 0)$. Then, a ray vector of the reflected light becomes $P2=(-\cos\theta\times\sin 2\alpha, \cos\theta\times\cos 2\alpha, \sin\theta)$.

The ray vector of the reflected light plotted in the phase space forms a circle having a radius of $\cos\theta$ on the xy plane, as shown in FIG. 6. In other words, the reflected light becomes divergent light having a conical plane, and a tertiary light source exists near a vertex of the conical plane. The tertiary light source internally exists as a virtual image when the cylindrical reflective surface has a convex as shown in FIG. 3A, and an externally exists as a real image when the cylindrical reflective surface has a concave shape as shown in FIG. 3B. When the reflective surface is a part of the cylindrical surface and its central angle is $2\phi$, as shown in FIG. 5, a ray vector P2 of the reflected light exists in an arc A having a central angle of $4\phi$ on the xy plane, as shown in FIG. 6.

Next, assume that a rotational paraboloid mirror has a focal length "f" with a focal point at a position of the tertiary light source, and an illuminated surface is distant by "f" from this mirror. The light emitted from the tertiary light source is converted into divergent light having a conical plane and then turned into collimated light after reflected on the mirror having the focal length f. The reflected light becomes a sheet beam having an arc section, a radius of $f\times\cos\theta$, and a central angle of $4\phi$. Therefore, only the arc area A having a radius of $f\times\cos\theta$ and a central angle $4\phi$ is illuminated on the illuminated surface shown in FIG. 6.

Figure 7:
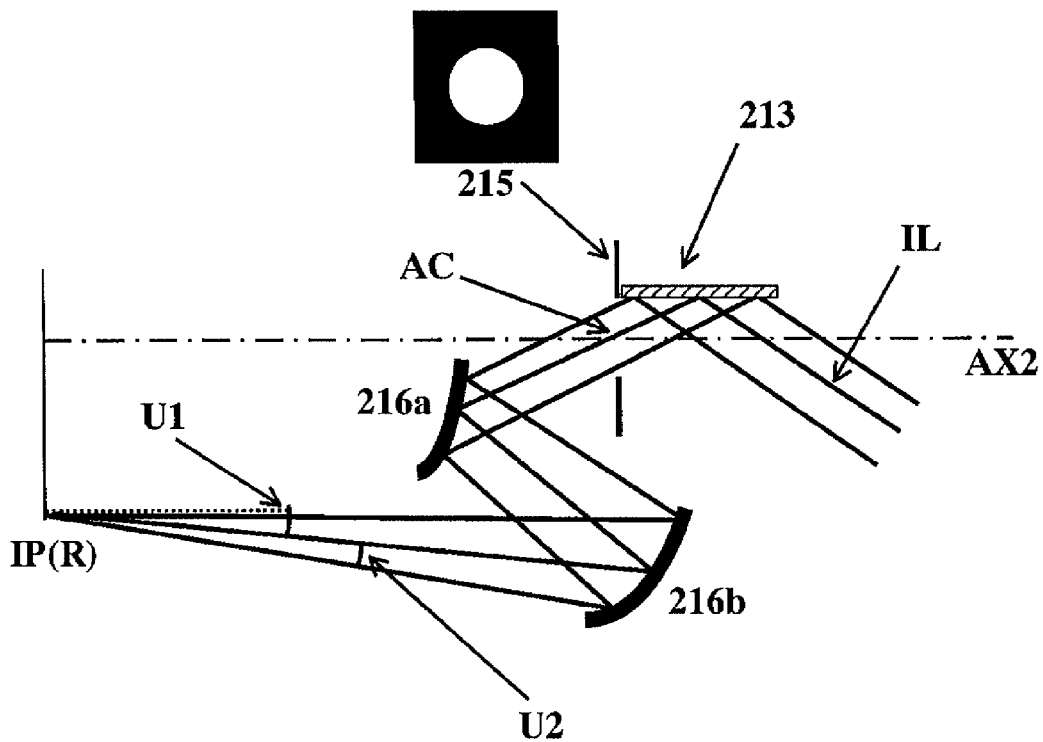
FIG. 7 is a view for explaining an operation when a luminous flux is incident upon the corrugate plate integrator.

While the behavior of the illumination light IL incident upon one cylindrical reflective surface has been discussed, a description will now be given of a behavior of the illumination light IL incident upon the corrugate plate integrator 213. FIG. 7 is a schematic sectional view of the corrugate plate integrator 213, upon which the illumination light IL is incident. In FIG. 7, IP denotes an illuminated surface, which is equivalent with the mask R.

The second condenser 216 is a coaxial system having an axis AX2 as a central symmetrical axis. The second condenser 216 maintains a Fourier transformation relationship between an aperture center AC of the aperture stop 215 and the illuminated surface IP. In other words, the aperture stop 215 corresponds to a pupil plane of the illuminated surface IP.

The second condenser 216 is configured to be non-telecentric on the image side, and an incident angle U1 of the image-side principle ray from the second condenser 216 upon the illuminated surface IP is set to be equal to an inclination angle of an object-side principal ray of the projection optical system 230. The principal ray inclines in such a direction that an interval between the rotationally symmetrical axis AX2 and the principal ray narrows as a distance to the illuminated surface IP reduces. For example, this embodiment sets the incident angle U1 to about 6°. In addition, this embodiment appropriately corrects blurs on the illuminated surface IP, setting a spot diameter to 5 mm or smaller, or 1 mm or smaller.

The incident angle of the principal ray upon the convex mirror 216a and the concave mirror 216b in the second condenser 216 is set to a low incident angle, more specifically 20° or smaller. This configuration reduces a blur amount that would otherwise occur in condensing the light upon the illuminated surface IP, and improves the condensing efficiency upon the arc illumination area. In addition, this configuration reduces the light loss that would otherwise occur due to light shielding by the slit 218, and improves the illumination efficiency.

An orientation of the arc of the arc illumination area inverts when the plane mirror 217 reflects and deflects the illumination light towards a direction of the mask R. In this case, the center of curvature of the arc illumination area is set to an intersection between the optical axis AX1 of the projection optical system 230 and the mask R. When U1 is set as described above, the image-side principal ray of the second condenser 216 can be accorded with the object-side principal ray of the projection optical system 230 before and after the mask R.

The angular distribution of the light reflected on each cylindrical reflective surface 213a in the corrugate plate integrator 213 is similar to that with a single cylindrical reflective surface. The light incident upon one point of the illuminated surface IP derives from the entire illumination region of the illumination light IL upon the corrugate plate integrator 213. The illumination light IL's angular spread (or condensing NA) is expressed by U2=D/f, where "D" is a diameter of the luminous flux of the illumination light IL, and "f" is a focal length of the second condenser 216.

In the arc illumination area, respective luminous fluxes from a multiplicity of cylindrical reflective surfaces 213a are superposed in a direction along the arc to achieve the luminance uniformity, thereby providing an efficient and uniform arc illumination.

Figure 8:
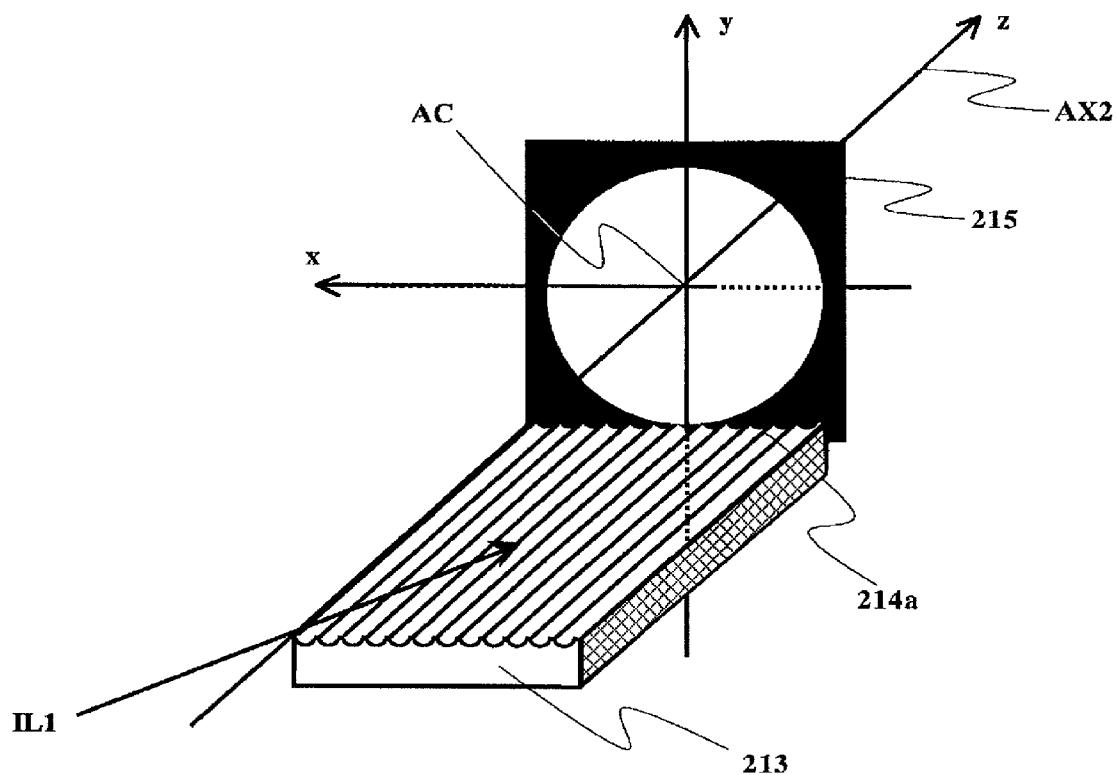
FIG. 8 is a schematic view showing an arrangement of the corrugate plate integrator and an aperture stop.

Referring now to FIG. 8, a detailed description will be given of an arrangement of the corrugate plate integrator 213 and the aperture stop 215. In FIG. 8, IL1 denotes a direction of the principal ray in the illumination light IL incident upon the corrugate plate integrator 213. The principal ray IL1 passes through the yz section near the center of the corrugate plate integrator 213. AC denotes a center of the aperture stop 215, as described above, and corresponds to the center of the pupil plane of the second optical condenser 216. While the xyz coordinate is described with an origin at the AC, the z axis accords with the optical axis AX2 of the second condenser 216. The integrator 213 may be provided with a driving mechanism (not shown) configured to adjust the illumination area.

The aperture stop 215 is arranged on the exit side of the corrugate plate integrator 213 so that its aperture can be perpendicular to the general line direction of each cylindrical reflective surface of the corrugate plate integrator 213. An aperture shape of the aperture stop 215 as illustrated is an example of a circular opening used for a standard illumination mode.

For fine adjustments of the effective light source distribution, the aperture stop 215 may be arranged and slightly inclined by about 1° to 2°, rather than perfectly perpendicular to the general line direction of the corrugate plate integrator 213. This embodiment also refers to the arrangement of the aperture stop 215, including such a slight inclination relative to the perpendicular, as a "perpendicular to the generating line direction of the cylindrical reflective mirror." In addition, in order to make the effective light source distribution and the degree of the telecentricity adjustable, a driving mechanism configured to adjust an angle of the aperture stop 215 relative to the corrugate plate integrator 213 may be provided.

When the aperture stop 215 is arranged on the exit side of the corrugate plate integrator 213, the effective light source distribution viewed from an arbitrary position in the arc illumination area can have a uniform shape. This is because all luminous fluxes from the first condenser 212 pass through the aperture stop 215 after entering the corrugate plate integrator 213.

Figures 9A, 9B:
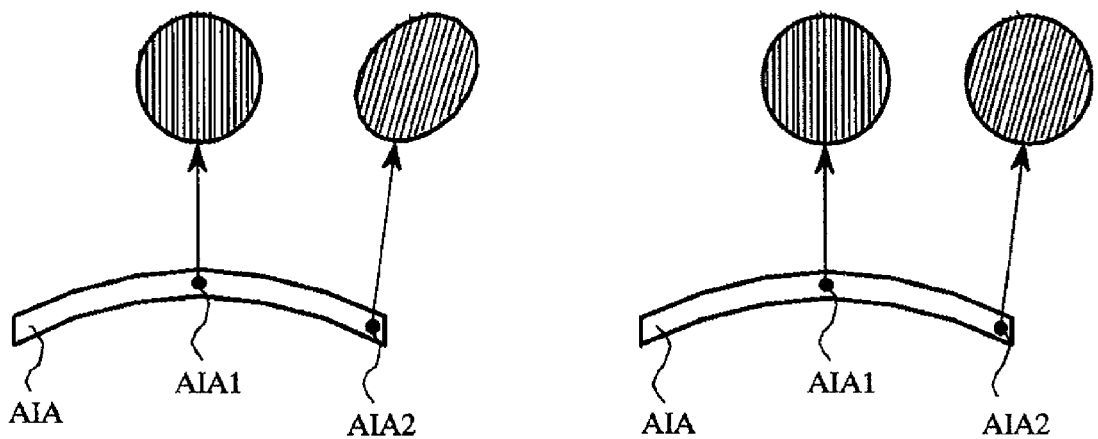
FIGS. 9A and 9B are views for explaining effective light source distributions.

FIGS. 9A and 9B show shapes of effective light source distributions viewed from respective positions in the arc illumination area. In these figures, AIA denotes an arc illumination area, and respective points AIA1 and AIA2 denote observation positions of the effective light source distribution at the center and at the end of the arc. FIG. 9A shows an effective light source distribution when the above aperture stop 215 is not arranged, and FIG. 9B is a view showing an effective light source distribution of this embodiment that arranges the aperture stop 215.

The effective light source at an arbitrary point in the illumination area has an angular distribution of the light that conically enters the point at a certain numerical aperture ("NA"). That a shape of the effective light source distribution is different according to positions in the illumination area means that there is an asymmetry of the exposure NA. The asymmetry of the exposure NA causes negative influence to the resolving characteristic.

FIG. 9A shows effective light source distributions without the above aperture stop 215. The center AIA1 of the arc area has a regularly circular distribution, but the end AIA2 of the arc area has an elliptical effective light source distribution since the distribution distorts due to lack of the aperture stop as a position moves to the end of the arc area. On the other hand, this embodiment provides, as clearly shown in FIG. 9B, the same shaped effective light source distribution viewed from any observation points, improving the symmetry of the exposure NA.

The lines drawn in the effective light source distributions shown in FIGS. 9A and 9B mean that the tertiary light sources generated by the corrugate plate integrator 213 have linear distributions. An interval in the lines depends upon a width of the cylindrical reflective surfaces in the corrugate plate integrator 213. As the width in a direction in which the cylindrical reflective surfaces are arranged is narrowed and the number of cylindrical reflective surfaces is increased relative to the overall width of the integrator, the interval of the tertiary light source can be narrower and the density of the effective light source distribution can be made finer.

Figure 10A:
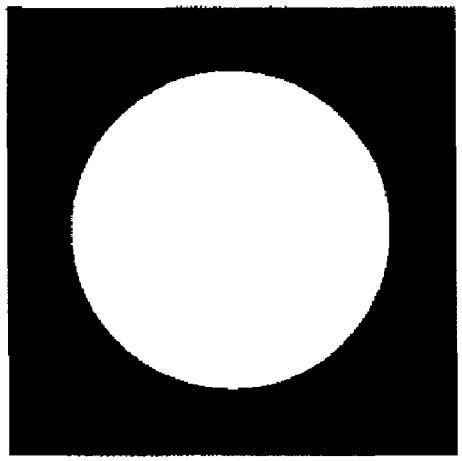
FIGS. 10A to 10D are schematic views of aperture stops used to switch an illumination mode.
Figure 10B:
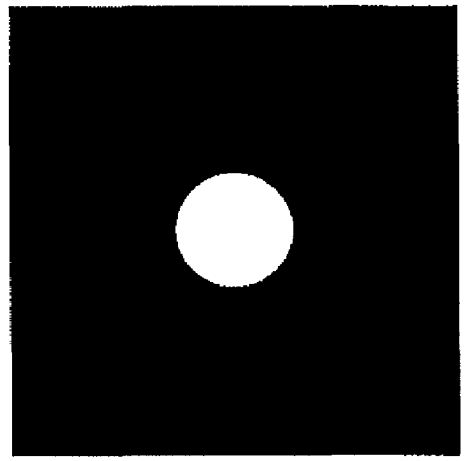
Figure 10C:
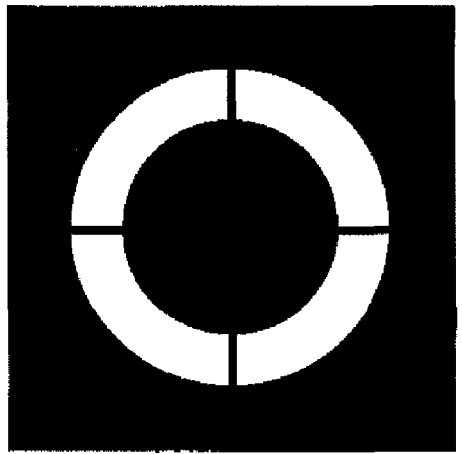
Figure 10D:
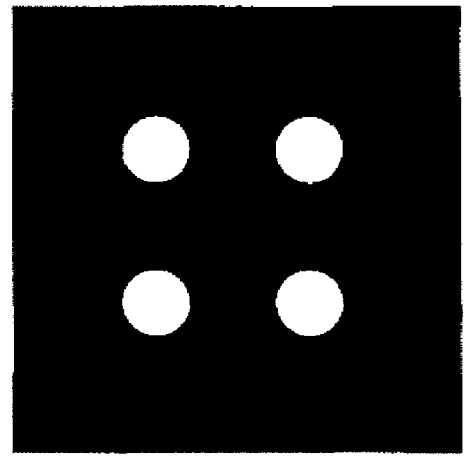

A description will be given of a method of changing a coherent factor σ and a method of providing a modified illumination, such as an annular illumination by switching the aperture stop 215. The aperture stop 215 and the pupil plane of the projection optical system 230 have a conjugate relationship, and an aperture shape of the aperture stop 215 or a light transmission pattern corresponds to a distribution on the pupil plane in the projection optical system. FIGS. 10A to 10D are plane views showing apertures' shapes applicable to the aperture stop 215: FIG. 10A shows a usual illumination mode with a large σ, FIG. 10B shows a usual illumination mode with a small σ, FIG. 10C shows an annular illumination mode, and FIG. 10D shows a quadrupole illumination mode.

When these some aperture patterns are lined up, for example, and sequentially changed by an aperture-stop driving system, any aperture shape can be selected.

Figure 11A:
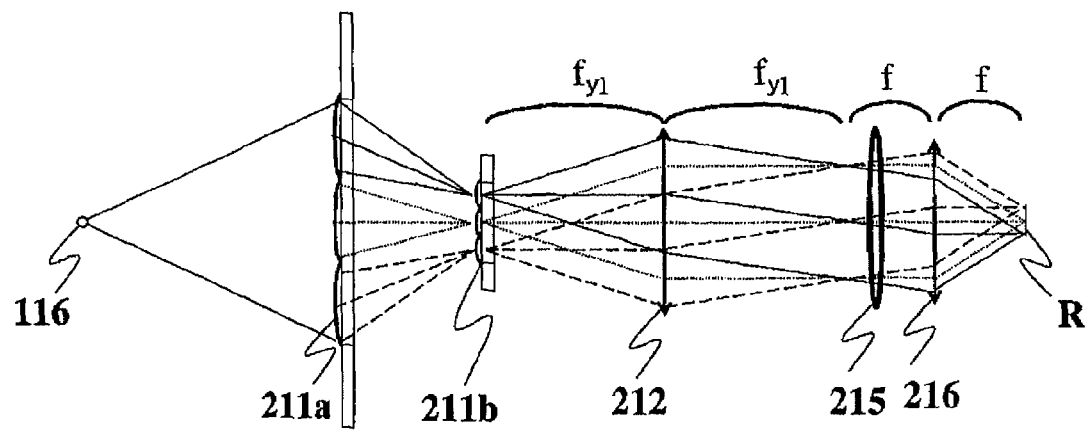
FIGS. 11A and 11B are views showing an arrangement of a second fly-eye lens and subsequent components when the first embodiment is expressed by a dioptric optical system.
Figure 11B:
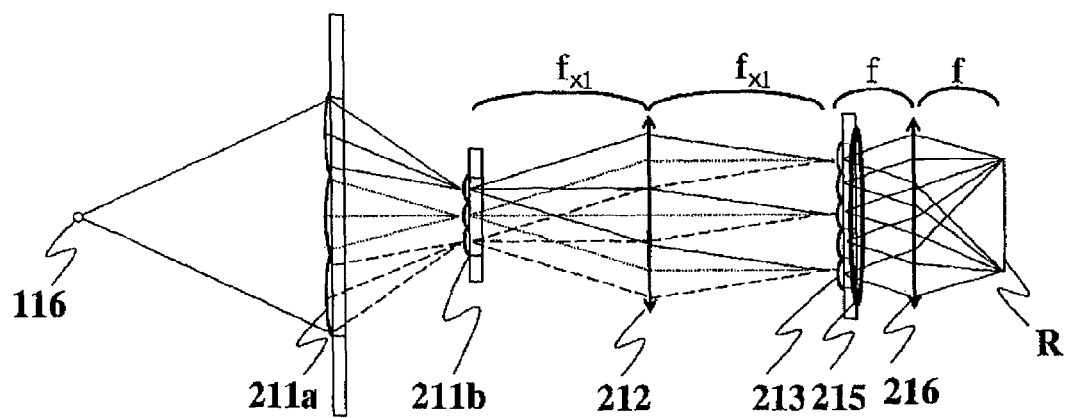

Referring now to FIGS. 11A and 11B, a detailed description will be given of an arrangement of the second fly-eye mirror 211b and the subsequent components, which arrangement is a major difference from a second embodiment, which will be described later. For simplicity, FIGS. 11A and 11B show an illumination optical system of this embodiment as a dioptric system although it is actually a catoptric optical system. FIG. 11A shows an arrangement in the slit width direction and changes the number of divisions of the fly-eye mirror for explanation convenience. In addition, the corrugate plate integrator 213 is omitted because it is similar to the plane mirror in the slit width direction. Each element mirror of the second fly-eye mirror 211b is conjugate with the light source, and the second fly-eye mirror 211b is angularly adjusted so that each divergent light faces the same direction. At this time, the first condenser 212 is arranged in the middle between the second fly-eye mirror 211b and the aperture stop 215. The first embodiment makes a distance between the second fly-eye mirror 211b and the first condenser 212 approximately equal to a focal length $fy_1$ of the first condenser 212, and provides a Koehler illumination to the aperture stop 215. However, these distances can be changed by adjusting an angle of the second fly-eye mirror 211b. Since the luminous flux that has passed through the aperture stop 215 forms an image on the reflection mask R via the second condenser 216, the second fly-eye mirror 211b and the reflection mask R have a conjugate relationship and are subject to the critical illumination.

On the other hand, in the slit length direction shown in FIG. 11B, the corrugate plate integrator 213 is located just before the aperture stop 215, and the Koehler illumination is provided to the corrugate plate integrator 213 so that the luminous fluxes from the second fly-eye mirror 211b can superpose on the corrugate plate integrator 213 via the first condenser 212.

Then, the Koehler-illuminated corrugate plate integrator 213 again divides the luminous fluxes into a plurality of tertiary light source, and the luminous flux re-divided by the corrugate plate integrator 213 illuminate and superpose on the reflection mask R via the second condenser 216.

The first condenser 212 may be used with such high incidences as an angle of 60° or higher. This is because the reflectance becomes high with the high incidence due to the incident angle characteristic of the reflection film. Thus, since the first condenser 212 uses a high incidence, use of a toroidal mirror is effective to correct the astigmatism by changing curvatures in the slit width direction and in the slit length direction.

Thus, the illumination optical system of this embodiment can restrain the unevenness of the effective light source which would otherwise occur due to the influence of the light intensity fluctuation and the angular distribution of the light source, and efficiently illuminate the arc area even with a light source having a large etendue.

Second Embodiment

Referring to FIG. 13, a detailed description will be given of an arrangement of the second fly-eye mirror 211b and the subsequent components, which arrangement is a major difference from the first embodiment. A schematic view of a principal part is the same as that of the first embodiment, and thus a repetitive description thereof is omitted.

Figure 13A:
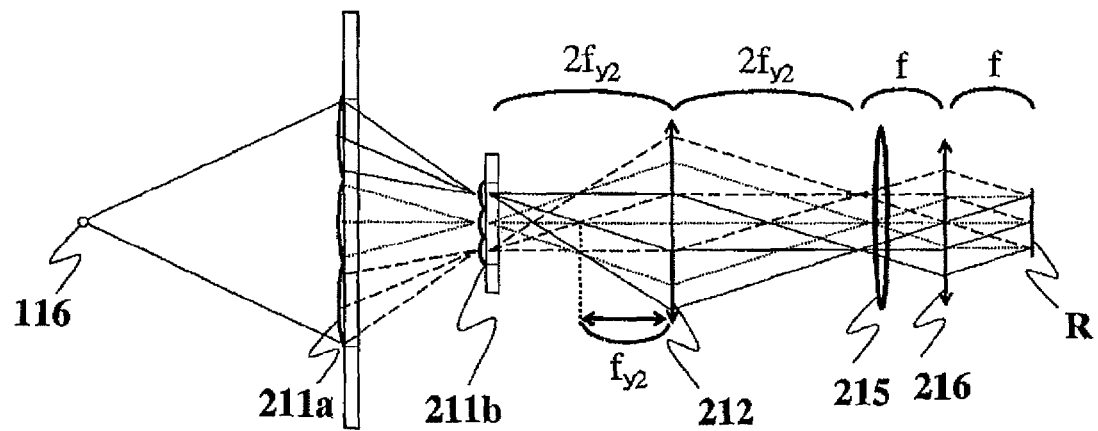
FIGS. 13A and 13B are views showing an arrangement of a second fly-eye lens and subsequent components when the second embodiment is expressed by a dioptric optical system.

FIG. 13A shows an arrangement of the second embodiment in the slit width direction. The second embodiment arranges the first condenser 212 in the middle between the second fly-eye mirror 211b and the aperture stop 215, similar to the first embodiment. However, different from the first embodiment, this embodiment sets a distance between the second fly-eye mirror 211b and the first condenser 212 twice as long as a focal length $fy_2$ of the first condenser 212. Since an image of the second fly-eye mirror 211b is formed at an equal magnification near the aperture stop 215, the aperture stop 215 is subject to the critical illumination. The second fly-eye mirror 211b may be angularly adjusted so that individual center rays of the second fly-eye mirror 211b can condense upon the focal position of the first condenser 212. The luminous fluxes that have passed through the aperture stop 215 are superposed on the reflection mask R by the second condenser 216, and provide a Koehler illumination to the mask R.

Figure 13B:
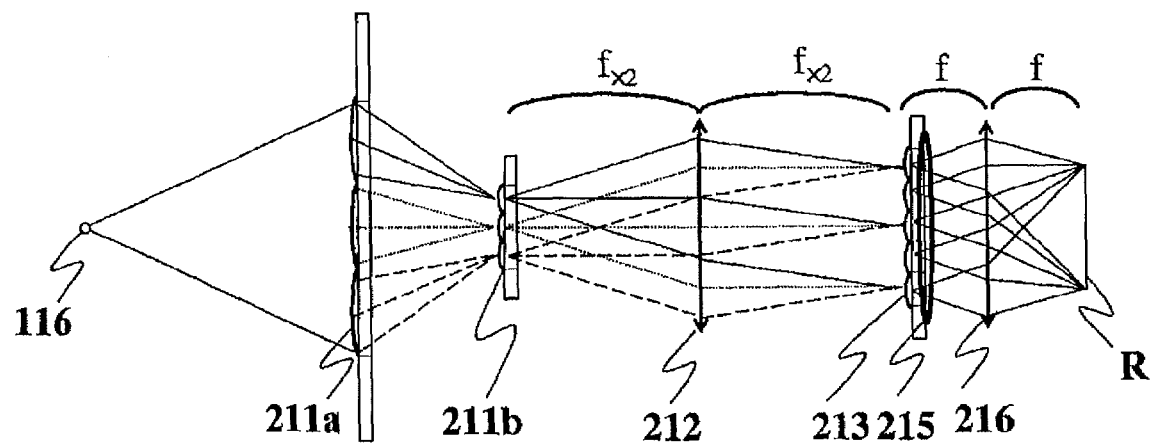

On the other hand, in the slit length direction shown in FIG. 13B, similar to the first embodiment, the corrugate plate integrator 213 and the reflection mask R are subject to the Koehler illumination. Although the second embodiment provides, different from the first embodiment, the position of the aperture stop 215 with different illuminations, i.e., the critical illumination in the slit width direction and the Koehler illumination in the slit length direction, the illumination area has an equal length in the slit width direction and in the slit length direction. Therefore, different from the first embodiment, the second embodiment may make different the number of divisions of the first fly-eye mirror 211a in the slit width direction from that in the slit length direction. Moreover, the second fly-eye mirror 211b may have such an anamorphic surface that the curvature in the slit width direction can be different from the curvature in the slit length direction.

Figure 14A:
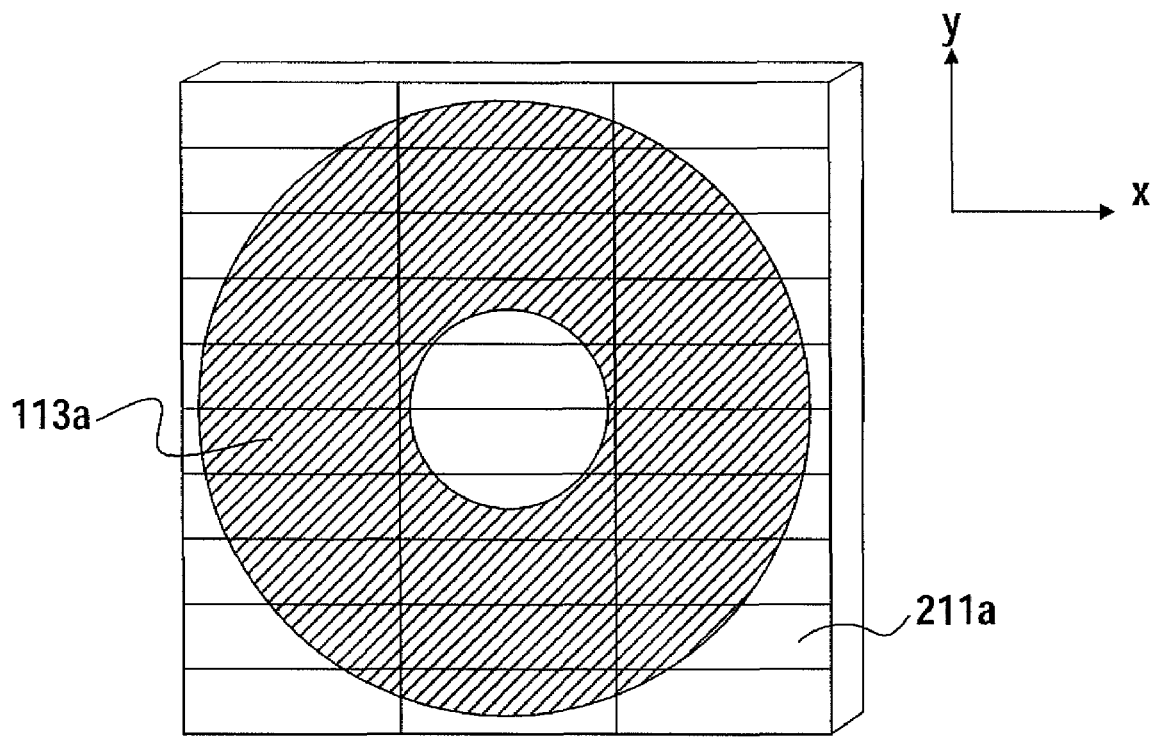
FIGS. 14A and 14B are views showing a fly-eye mirror according to the second embodiment.
Figure 14B:
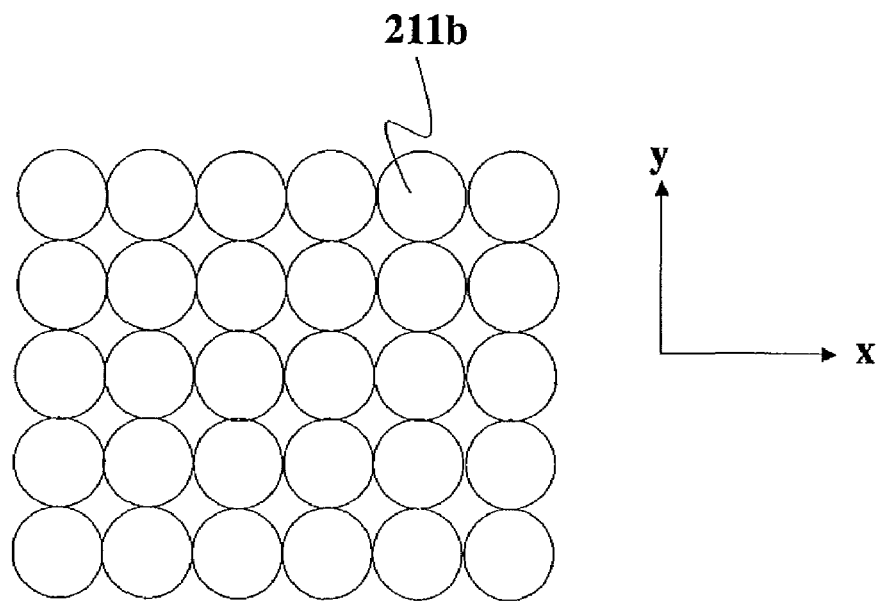

The second embodiment sets the number of divisions to 10×3 in the slit width direction and in the slit length direction of the first fly-eye mirror 211a, as shown in FIG. 14A, and the number of divisions of the second fly-eye mirror 211b to 5×6, as shown in FIG. 14B. Therefore, due to the first fly-eye mirror 211a, the Lagrange's invariant of each element mirror is about 1/10 as much as that of the light source in the slit width direction and about 1/3 as much as that of the light source in the slit length direction. The Lagrange's invariant of each element mirror is summed up by the number of the second fly-eye mirror 211b in the slit width direction and the number of it in the length direction. Therefore, even in the second embodiment, like the first embodiment, the Lagrange's invariant that has passed through the fly-eye mirror becomes half {(1/10)×5} in the slit width direction and twice {(1/3)×6} as much as that of the light source.

The second embodiment provides a critical illumination by forming an image of a second fly-eye mirror 211b near the aperture stop 215 at an equal magnification, but may provide a critical illumination through imaging at an enlarged or reduced magnification. In addition, as described for the first embodiment, the first condenser 212 does not have to be arranged at an equal distance from both of the second fly-eye mirror 211b and the aperture stop 215.

Even the illumination optical system of this embodiment can restrain the unevenness of the effective light source caused by the influence of the light intensity fluctuation and the angular distribution of the light source, and efficiently illuminate the arc area even with a light source having a large etendue, similar to the first embodiment.

The device (such as a semiconductor integrated circuit device or a liquid crystal display device) is manufactured by the step of exposing a photoresist applied substrate (such as a wafer or a glass plate) by using the exposure apparatus according to one of the above embodiments, the step of developing the substrate, and another well-known step. Thus, the device manufacturing method using the above exposure apparatus, and resultant devices constitute one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. For example, while this embodiment uses the EUV light, the present invention is applicable to a light source in a vacuum UV or x-ray region.

This application claims the benefit of Japanese Patent Application No. 2008-045504, filed Feb. 27, 2008, which is hereby incorporated by reference herein in its entirety.

What is claimed is:

1. An illumination optical system comprising:
a pair of fly-eye mirrors configured to receive light from a light source;
a first condenser configured to condense light from the pair of fly-eye mirrors;
a reflection type integrator configured to receive light from the first condenser, the reflection type integrator including a plurality of cylindrical reflective surfaces having parallel generating line directions;
an aperture stop arranged perpendicular to the generating line direction; and
a second condenser configured to superpose on an illuminated surface luminous fluxes from a plurality of cylindrical reflective surfaces of the reflection type integrator,
wherein a pair of fly-eye mirror includes a first fly-eye mirror that includes a plurality of element mirrors, and a second fly-eye mirror that includes a plurality of element mirrors each corresponding to one of the element mirrors of the first fly-eye mirror, and
wherein the number of element mirrors of at least one of the first fly-eye mirror and the second fly-eye mirror is different between in the generating line direction and in an arrangement direction of the plurality of cylindrical reflective surfaces.

2. An illumination optical system according to claim 1, wherein the first condenser is configured to provide a Koehler illumination to the reflection type integrator by using light from the second fly-eye mirror.

3. An illumination optical system according to claim 1, wherein the first condenser is configured to provide a critical illumination to the reflection type integrator in the generating line direction and a Koehler illumination to the reflection type integrator in the arrangement direction, by using light from the second fly-eye mirror.

4. An illumination optical system according to claim 3, wherein each element mirror in the second fly-eye minor has an anamorphic surface shape.

5. An exposure apparatus configured to exposure a pattern of an original onto a substrate, the exposure apparatus comprising:
an illumination optical system configured to illuminate an original by using light from a light source;
wherein the illumination optical system includes:
a pair of fly-eye mirrors configured to receive light from a light source;
a first condenser configured to condense light from the pair of fly-eye mirrors;
a reflection type integrator configured to receive light from the first condenser, the reflection type integrator including a plurality of cylindrical reflective surfaces having parallel generating line directions;
an aperture stop arranged perpendicular to the generating line direction; and
a second condenser configured to superpose on an illuminated surface of the original luminous fluxes from a plurality of cylindrical reflective surfaces of the reflection type integrator,
wherein a pair of fly-eye mirror includes a first fly-eye mirror that includes a plurality of element mirrors, and a second fly-eye mirror that includes a plurality of element mirrors each corresponding to one of the element mirrors of the first fly-eye mirror, and
wherein the number of element mirrors of at least one of the first fly-eye mirror and the second fly-eye mirror is different between in the generating line direction and in an arrangement direction of the plurality of cylindrical reflective surfaces.

6. A device manufacturing method comprising the steps of:
exposing a substrate by using an exposure apparatus; and
developing the substrate that has been exposed,
wherein the exposure apparatus includes:
an illumination optical system configured to illuminate an original by using light from a light source; and
a pair of fly-eye mirrors configured to receive light from a light source;
a first condenser configured to condense light from the pair of fly-eye mirrors;
a reflection type integrator configured to receive light from the first condenser, the reflection type integrator including a plurality of cylindrical reflective surfaces having parallel generating line directions;
an aperture stop arranged perpendicular to the generating line direction; and
a second condenser configured to superpose on an illuminated surface of the original luminous fluxes from a plurality of cylindrical reflective surfaces of the reflection type integrator,
wherein a pair of fly-eye mirror includes a first fly-eye mirror that includes a plurality of element mirrors, and a second fly-eye mirror that includes a plurality of element mirrors each corresponding to one of the element mirrors of the first fly-eye mirror, and
wherein the number of element mirrors of at least one of the first fly-eye mirror and the second fly-eye mirror is different between in the generating line direction and in an arrangement direction of the plurality of cylindrical reflective surfaces.

* * * * *